(12) United States Patent
Ikeuchi et al.

(10) Patent No.: US 12,343,760 B2
(45) Date of Patent: Jul. 1, 2025

(54) PIEZOELECTRIC DEVICE

(71) Applicant: Murata Manufacturing Co., Ltd., Nagaokakyo (JP)

(72) Inventors: Shinsuke Ikeuchi, Nagaokakyo (JP); Seiji Umezawa, Nagaokakyo (JP); Fumiya Kurokawa, Nagaokakyo (JP); Masayuki Suzuki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 743 days.

(21) Appl. No.: 17/724,523

(22) Filed: Apr. 20, 2022

(65) Prior Publication Data

US 2022/0241817 A1    Aug. 4, 2022

Related U.S. Application Data

(63) Continuation of application No. PCT/JP2020/028652, filed on Jul. 27, 2020.

(30) Foreign Application Priority Data

Nov. 21, 2019  (JP) .................................. 2019-210740

(51) Int. Cl.
*B06B 1/06* (2006.01)
*H10N 30/30* (2023.01)
(Continued)

(52) U.S. Cl.
CPC ......... *B06B 1/0603* (2013.01); *H10N 30/306* (2023.02); *H10N 30/8542* (2023.02); *H10N 30/88* (2023.02)

(58) Field of Classification Search
CPC .............. B06B 1/0603; H10N 30/8542; H10N 30/306; H10N 30/88
See application file for complete search history.

(56) References Cited

U.S. PATENT DOCUMENTS 5,633,552 A     5/1997 Lee et al.
2012/0250909 A1 10/2012 Grosh et al.
(Continued)

FOREIGN PATENT DOCUMENTS

JP  2008-259100 A  10/2008
JP  2009-088685 A   4/2009
(Continued)

OTHER PUBLICATIONS

Official Communication issued in International Patent Application No. PCT/JP2020/028652 mailed on Sep. 8, 2020.

*Primary Examiner* — Sean Gugger
(74) *Attorney, Agent, or Firm* — Keating & Bennett, LLP

(57) ABSTRACT

A piezoelectric device includes an outer base, a protruding base, and only one cantilevered portion. A protruding base includes a protrusion and a tip portion. The protrusion protrudes from an internal circumferential surface of the outer base toward a center of a ring shape. The tip portion is connected to the protrusion and located at the center. The cantilevered portion is connected to the tip portion, and extends while being spaced apart from the protrusion. The cantilevered portion includes a fixed end portion and a free periphery. The fixed end portion is connected to the tip portion. The free periphery is located along the internal circumferential surface. The protrusion is located between a first end and a second end of the free periphery.

20 Claims, 10 Drawing Sheets

(51) Int. Cl.
*H10N 30/853* (2023.01)
*H10N 30/88* (2023.01)

(56) References Cited

U.S. PATENT DOCUMENTS

2018/0188212 A1 7/2018 Ono et al.
2021/0094071 A1* 4/2021 Yamada .................. G01S 7/521

FOREIGN PATENT DOCUMENTS

| JP | 2011-018959 A | 1/2011 |
| JP | 2014-515214 A | 6/2014 |
| JP | 2017-041824 A | 2/2017 |

* cited by examiner

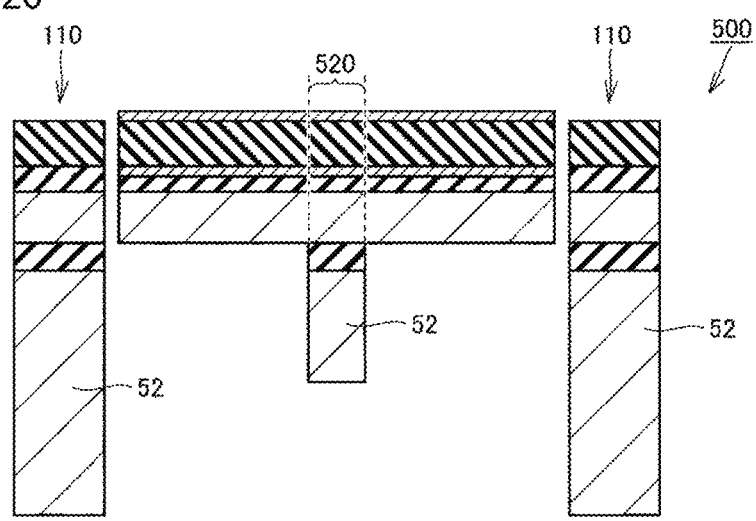

PIEZOELECTRIC DEVICE

CROSS REFERENCE TO RELATED APPLICATIONS

This application claims the benefit of priority to Japanese Patent Application No. 2019-210740 filed on Nov. 21, 2019 and is a Continuation application of PCT Application No. PCT/JP2020/028652 filed on Jul. 27, 2020. The entire contents of each application are hereby incorporated herein by reference.

BACKGROUND OF THE INVENTION

1. Field of the Invention

The present invention relates to a piezoelectric device.

2. Description of the Related Art

Examples of documents disclosing the structure of a piezoelectric device include Japanese Unexamined Patent Application Publication No. 2014-515214, U.S. Pat. No. 5,633,552, and Japanese Unexamined Patent Application Publication No. 2017-041824.

A piezoelectric device described in Japanese Unexamined Patent Application Publication No. 2014-515214 is a MEMS transducer, and includes a substrate and multiple cantilevered beams. The cantilevered beams are tapered and adjacent to each other. Each cantilevered beam defines a beam base, a beam tip, and a beam body. The beam body is disposed between the beam base and the beam tip. The cantilevered beams are arranged such that each of the beam tips extends toward a common virtual point. Each beam is joined to the substrate along the beam base, and is free from the substrate along the beam body.

A piezoelectric device described in U.S. Pat. No. 5,633,552 is a micromechanical device, and includes a frame and at least one cantilever structure. The frame has an opening. The cantilever structure is attached to the frame along a portion of a perimeter of the opening. The cantilever structure covers a majority of the opening. The cantilever structure includes three sublayers. The three sublayers include a first sublayer, a second sublayer, and a third sublayer. The second sublayer is adjacent to the first and third sublayers. The first and third sublayers are made of substantially the same first material, and have about the same average stress. The second sublayer is made of a second material, and has a minimum stress and a maximum stress. The difference between the maximum stress and the minimum stress is less than the average stress of the first sublayer. The opening may be a square.

A piezoelectric device described in Japanese Unexamined Patent Application Publication No. 2017-041824 is a detection device that detects acoustic waves propagated through air, and has a cantilever structure. The cantilever structure has a fixed end and a free end. The cantilever structure includes a first electrode and a second electrode. The first electrode has a plate shape, and vibrates by being bent by acoustic waves. The second electrode has a plate shape, and opposes the first electrode at a predetermined distance. The cantilever structure detects acoustic waves based on a change in electrostatic capacitance between the first electrode and the second electrode. An end of the second electrode in a direction from the fixed end and the free end is located closer to the fixed end than to the free end.

SUMMARY OF THE INVENTION

The piezoelectric device described in Japanese Unexamined Patent Application Publication No. 2014-515214 includes multiple cantilevered beams. When the piezoelectric device is driven, these cantilevered beams may vibrate in different phases. In such a case, the device characteristics of the piezoelectric device may rather be lowered. The piezoelectric device described in each of U.S. Pat. No. 5,633,552 and Japanese Unexamined Patent Application Publication No. 2017-041824 includes one cantilever structure, that is, one cantilevered portion. However, the piezoelectric device including only one cantilevered portion exerts a lower force to push a medium around the cantilevered portion than the force exerted by a piezoelectric device including multiple cantilevered portions, and thus has lower device characteristics.

The device characteristics of a piezoelectric device including only one cantilevered portion may be improved by increasing the area of the cantilevered portion when the cantilevered portion is viewed in a direction of vibrations of the cantilevered portion, to increase the volume of a medium around the cantilevered portion pushed by the cantilevered portion at an application of a predetermined voltage. However, an increase of the area of the cantilevered portion may lower resonant frequency intrinsic to the cantilevered portion.

Preferred embodiments of the present invention provide piezoelectric devices that each improve device characteristics while reducing changes in resonant frequency of a cantilevered portion.

A piezoelectric device according to a preferred embodiment of the present invention includes an outer base, a protruding base, and one cantilevered portion. The outer base has a ring shape and includes an internal circumferential surface. The protruding base includes a protrusion and a tip portion. The protrusion protrudes from the internal circumferential surface of the outer base toward a center of the ring shape. The tip portion is connected to the protrusion and located at the center. The cantilevered portion is connected to the tip portion, and extends while being spaced apart from the protrusion. The cantilevered portion includes a piezoelectric layer, a first electrode layer, and a second electrode layer. The first electrode layer is located on one side of the piezoelectric layer. The second electrode layer opposes at least a portion of the first electrode layer with the piezoelectric layer interposed therebetween. The cantilevered portion includes a fixed end portion and a free periphery. The fixed end portion is connected to the tip portion. The free periphery is located along the internal circumferential surface. The protrusion is located between a first end and a second end of the free periphery.

Preferred embodiments of the present invention improve the device characteristics while reducing changes in resonant frequency of a cantilevered portion.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 20 is a cross-sectional view of a piezoelectric device according to Preferred Embodiment 5 of the present invention.

DETAILED DESCRIPTION OF THE PREFERRED EMBODIMENTS

A piezoelectric device according to each of preferred embodiments of the present invention will be described with reference to the drawings below. In the following description of the preferred embodiments, the same or equivalent components are denoted with the same reference signs without being described redundantly.

Preferred Embodiment 1

Figure 1:
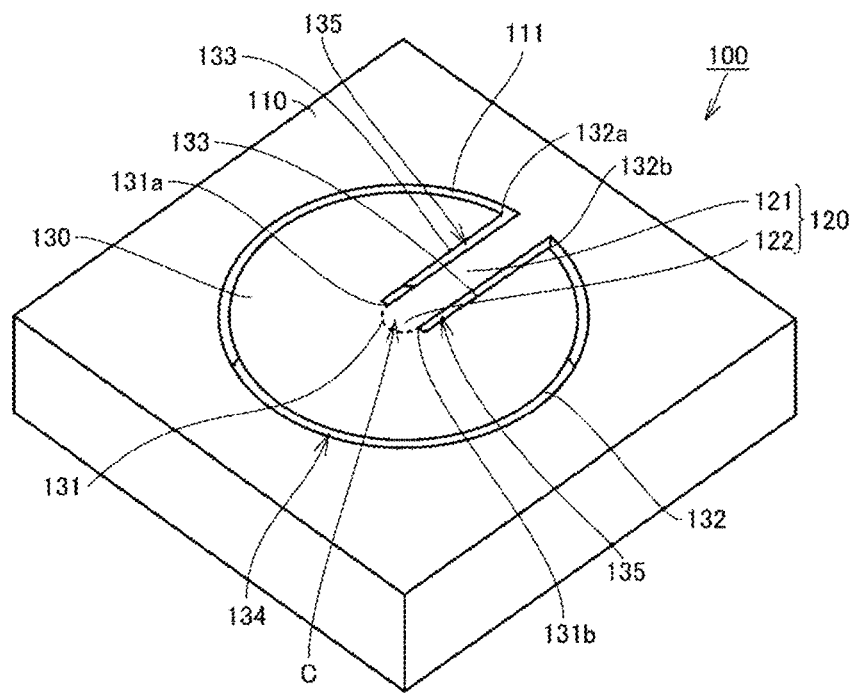
FIG. 1 is a perspective view of a piezoelectric device according to Preferred Embodiment 1 of the present invention, viewed from one side.
Figure 2:
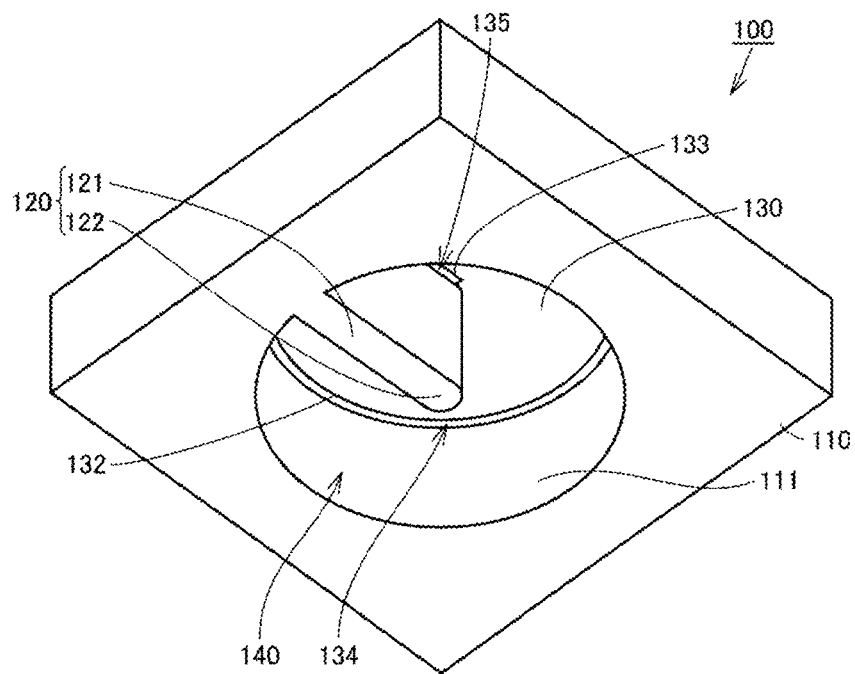
FIG. 2 is a perspective view of the piezoelectric device according to Preferred Embodiment 1 of the present invention, viewed from another side.
Figure 3:
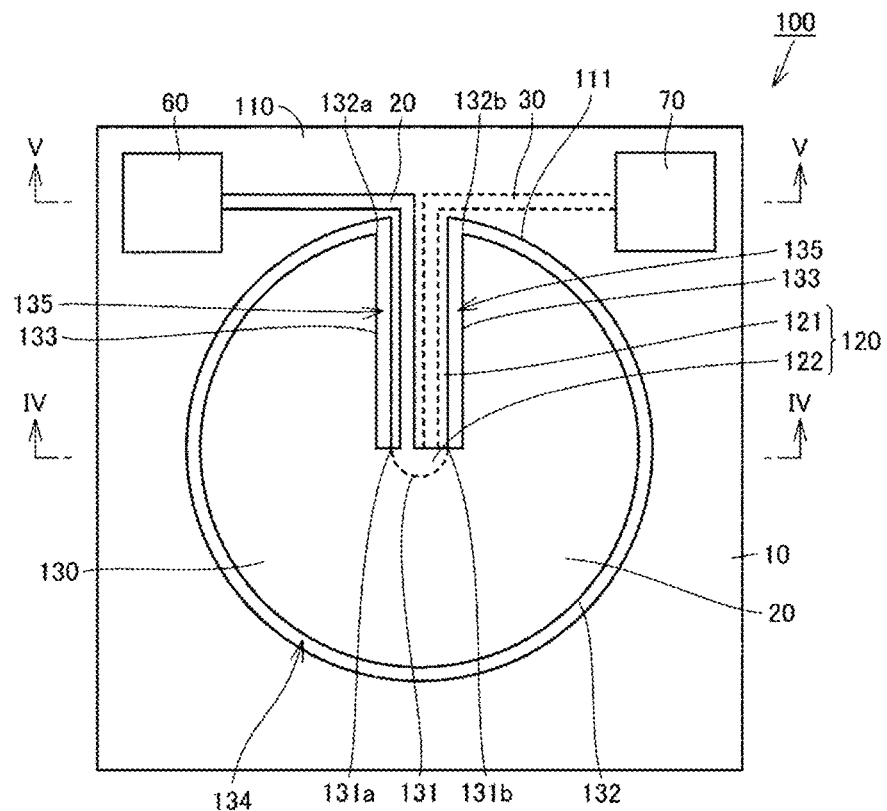
FIG. 3 is a plan view of the piezoelectric device according to Preferred Embodiment 1 of the present invention.

FIG. 1 is a perspective view of a piezoelectric device according to Preferred Embodiment 1 of the present invention, viewed from one side. FIG. 2 is a perspective view of the piezoelectric device according to Preferred Embodiment 1 of the present invention, viewed from another side. FIG. 3 is a plan view of the piezoelectric device according to Preferred Embodiment 1 of the present invention.

As illustrated in FIGS. 1 to 3, a piezoelectric device 100 includes an outer base 110, a protruding base 120, and only one cantilevered portion 130.

The outer base 110 has a ring shape and includes an internal circumferential surface 111. According to the present preferred embodiment, when viewed in an axial direction of a center axis of the ring shape of the outer base 110, the internal circumferential surface 111 is located on a virtual circle.

The protruding base 120 includes a protrusion 121 and a tip portion 122. The protrusion 121 protrudes from the internal circumferential surface 111 of the outer base 110 toward a center C of the ring shape. When viewed in the axial direction of the center axis, the protrusion 121 protrudes rectilinearly. When viewed in the axial direction of the center axis, the protrusion 121 has a uniform or substantially uniform width in a direction orthogonal to a direction in which the protrusion 121 protrudes. The case where the width of the protrusion 121 is uniform or substantially uniform includes the case where the width of the protrusion 121 falls within the range of about +/−5% of the mean value of the width of the protrusion 121.

The tip portion 122 is connected to the protrusion 121, and located at the center C. According to the present preferred embodiment, when viewed in the axial direction of the center axis, the tip portion 122 has a semicircular profile. When viewed in the axial direction of the center axis, the tip portion 122 has a diameter the same as the width of the protrusion 121.

The cantilevered portion 130 is connected to the tip portion 122, and extends while being spaced apart from the protrusion 121. The cantilevered portion 130 includes a fixed end portion 131, a free periphery 132, and two side end portions 133.

The fixed end portion 131 is connected to the tip portion 122. Specifically, when viewed in the axial direction of the center axis, the fixed end portion 131 is connected to a circumferential surface of the tip portion 122 at a portion of the tip portion 122 other than a portion connected to the protrusion 121. More specifically, when viewed in the axial direction of the center axis, the fixed end portion 131 has an arc shape.

The free periphery 132 is located along the internal circumferential surface 111. According to the present preferred embodiment, when viewed in an axial direction of the center axis of the ring shape of the outer base 110, the free periphery 132 is located on a virtual circle. In other words, when viewed in the axial direction of the center axis, the virtual circle is located concentric with the arc-shaped fixed end portion 131.

A first slit 134 is provided between the free periphery 132 and the internal circumferential surface 111. The first slit 134 has a uniform or substantially uniform width in a direction along the internal circumferential surface 111. The case where the width of the first slit 134 is uniform or substantially uniform includes the case where the width of the first slit 134 falls within a range of about +/−5% of the mean value of the width of the first slit 134. The protrusion 121 is located between a first end 132a and a second end 132b of the free periphery 132. The first end 132a and the second end 132b of the free periphery 132 are located to allow the first slit 134 to reach the protrusion 121. More preferably, the first end 132a and the second end 132b of the free periphery 132 are located to allow the first slit 134 to reach the side of the protrusion 121 opposite to the side facing the tip portion 122.

Second slits 135 connected to the first slit 134 are each provided between the protrusion 121 and a corresponding one of the two side end portions 133. The width of the second slits 135 is uniform or substantially uniform in a direction in which the protrusion 121 protrudes. The case where the width of the second slits 135 is uniform or substantially uniform includes a case where the width of the second slits 135 falls within a range of about +/−5% of the mean value of the width of the second slit 135. Each of the two side end portions 133 defines the corresponding second slit 135, and connects both ends 131a and 131b of the fixed end portion 131 to both ends 132a and 132b of the free periphery 132 in the shortest distance. The width of the first slit 134 is the same or substantially the same as the width of the second slits 135. This structure can reduce or prevent an escape of the force exerted by the cantilevered portion 130 on the surrounding medium or the force that the cantilevered portion 130 receives from the medium through either the first slit 134 or the second slits 135 having a larger width. The case where the width of the first slit 134 is the same or substantially the same as the width of the second slits includes a case where the absolute value of a difference between the width of the first slit 134 and the width of the second slits 135 falls within about 5% of the width of the first slit 134 or the width of the second slits 135.

As the width of each of the first slit 134 and the second slits 135 decreases further, the device characteristics of the piezoelectric device 100 improve further. For example, as the width of each of the first slit 134 and the second slits 135 decreases further, the piezoelectric device 100 used as an ultrasonic transducer can further reduce or prevent an escape of the force exerted by the cantilevered portion 130 on the medium surrounding the cantilevered portion 130 or the force that the cantilevered portion 130 receives from the medium from the first slit 134 and the second slits 135. For example, the width of each of the first slit 134 and the second slits 135 is preferably smaller than or equal to about 10 µm, and more preferably smaller than or equal to about 1 µm.

In the piezoelectric device 100 according to Preferred Embodiment 1 of the present invention, the shortest distance from the fixed end portion 131 to the free periphery 132 is preferably at least five times of the thickness of the cantilevered portion 130 in the axial direction of the center axis from the viewpoint of facilitating bending vibrations of the cantilevered portion 130.

Figure 4:
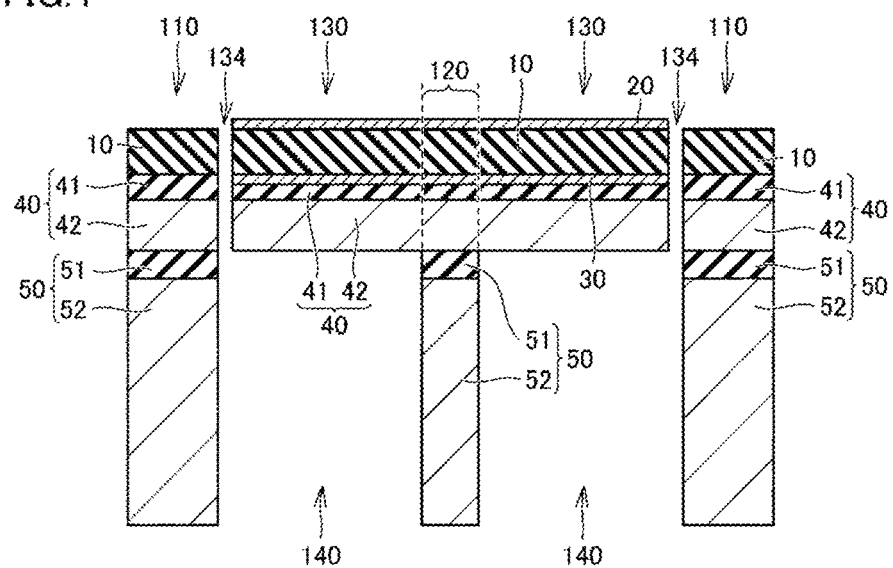
FIG. 4 is a cross-sectional view of the piezoelectric device illustrated in FIG. 3 taken along line IV-IV and viewed in the arrow direction.
Figure 5:
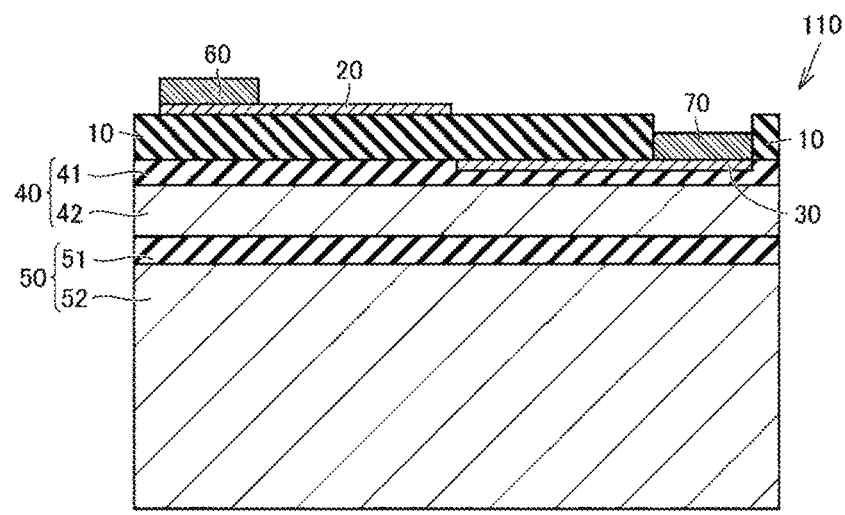
FIG. 5 is a cross-sectional view of the piezoelectric device illustrated in FIG. 3 taken along line V-V and viewed in the arrow direction.

Subsequently, components of the cantilevered portion 130 will be described. FIG. 4 is a cross-sectional view of the piezoelectric device illustrated in FIG. 3 taken along line IV-IV and viewed in the arrow direction. In FIG. 4 and FIG. 5 described later, the thickness of each component is schematically illustrated.

As illustrated in FIGS. 3 and 4, the cantilevered portion 130 includes a piezoelectric layer 10, a first electrode layer 20, a second electrode layer 30, and a support layer 40.

As illustrated in FIG. 4, the piezoelectric layer 10 is preferably made of a single crystal material. The cutting direction of the piezoelectric layer 10 is appropriately selected to exert desired device characteristics. According to the present preferred embodiment, the piezoelectric layer 10 is a thinned single-crystal substrate, and specifically, the single-crystal substrate is a rotated Y-cut substrate. Preferably, the cutting direction of the rotated Y-cut substrate is about 30°, for example. The thickness of the piezoelectric layer 10 is, for example, greater than or equal to about 0.3 µm and smaller than or equal to about 5.0 µm.

The material of the piezoelectric layer 10 is selected as appropriate to allow the piezoelectric device 100 to exert desired device characteristics. According to the present preferred embodiment, the piezoelectric layer 10 is made of an inorganic material. Specifically, the piezoelectric layer 10 is made of an alkali niobate compound or an alkali tantalate compound. According to the present preferred embodiment, alkali metal contained in the alkali niobate compound or the alkali tantalate compound includes at least one of lithium, sodium, and potassium. According to the present preferred embodiment, the piezoelectric layer 10 is made of lithium niobate ($LiNbO_3$) or lithium tantalate ($LiTaO_3$).

The first electrode layer 20 is disposed on one side of the piezoelectric layer 10 in the axial direction of the center axis. The second electrode layer 30 opposes at least a portion of the first electrode layer 20 with the piezoelectric layer 10 interposed therebetween in the cantilevered portion 130. According to the present preferred embodiment, close contact layers not illustrated are respectively disposed between the first electrode layer 20 and the piezoelectric layer 10, and between the second electrode layer 30 and the piezoelectric layer 10.

When viewed in the axial direction of the center axis of the internal circumferential surface 111, that is, the axial direction of the center axis of the ring shape, the area of the opposing portion where the first electrode layer 20 opposes the second electrode layer 30 in the cantilevered portion 130 is greater than or equal to about 90% of the area of the cantilevered portion 130. As illustrated in FIGS. 3 and 4, according to the present preferred embodiment, the first electrode layer 20 and the second electrode layer 30 overlap the entirety of the cantilevered portion 130 when viewed in the axial direction. Specifically, according to the present preferred embodiment, the area of the opposing portion where the first electrode layer 20 opposes the second electrode layer 30 in the cantilevered portion 130 is the same or substantially the same as the area of the cantilevered portion 130. The case where the area of the opposing portion is the same or substantially the same as the area of the cantilevered portion 130 includes the case where the area of the opposing portion is larger than or equal to about 95% of the area of the cantilevered portion 130.

According to the present preferred embodiment, each of the first electrode layer 20 and the second electrode layer 30 is made of Pt. Each of the first electrode layer 20 and the second electrode layer 30 may be made of another material such as Al. The close contact layers are made of Ti. The close contact layers may be made of another material such as NiCr. Each of the first electrode layer 20, the second electrode layer 30, and the close contact layers may be an epitaxially grown film. When the piezoelectric layer 10 is made of lithium niobate ($LiNbO_3$), the close contact layers are preferably made of NiCr to prevent the material of the close contact layers from being diffused into the first electrode layer 20 or the second electrode layer 30. This structure improves the reliability of the piezoelectric device 100.

According to the present preferred embodiment, the thickness of each of the first electrode layer 20 and the second electrode layer 30 is, for example, greater than or equal to about 0.05 μm and smaller than or equal to about 0.2 μm. The thickness of the close contact layers is, for example, greater than or equal to about 0.005 μm and smaller than or equal to about 0.05 μm.

As illustrated in FIG. 4, the support layer 40 is located on a side of the piezoelectric layer 10 facing the second electrode layer 30, and on a side of the second electrode layer 30 opposite to the side facing the piezoelectric layer 10 in the axial direction of the center axis. The support layer 40 includes a first support layer 41 and a second support layer 42 laminated on the side of the first support layer 41 opposite to the side facing the piezoelectric layer 10. According to the present preferred embodiment, the first support layer 41 is made of $SiO_2$, and the second support layer 42 is made of a single crystal Si. According to the present preferred embodiment, the support layer 40 preferably has a thickness larger than the thickness of the piezoelectric layer 10 from the viewpoint of bending vibrations of the cantilevered portion 130. The mechanism of bending vibrations of the cantilevered portion 130 will be described later.

Subsequently, components of the protruding base 120 will be described. As illustrated in FIG. 4, as in the cantilevered portion 130, the protruding base 120 includes the piezoelectric layer 10, the first electrode layer 20, the second electrode layer 30, and the support layer 40. In the in-plane direction orthogonal to the axial direction of the center axis, the piezoelectric layer 10, the first electrode layer 20, the second electrode layer 30, and the support layer 40 of the protruding base 120 are respectively continuous with the piezoelectric layer 10, the first electrode layer 20, the second electrode layer 30, and the support layer 40 of the cantilevered portion 130.

As illustrated in FIGS. 3 and 4, at the tip portion 122, the second electrode layer 30 is disposed to oppose at least part of the first electrode layer 20 with the piezoelectric layer 10 interposed therebetween. As illustrated in FIG. 3, at the protrusion 121, the second electrode layer 30 is disposed not to oppose the first electrode layer 20 with the piezoelectric layer 10 interposed therebetween.

As illustrated in FIG. 4, the protruding base 120 further includes a substrate layer 50. The substrate layer 50 is connected to the side of the support layer 40 opposite to the side facing the second electrode layer 30. The substrate layer 50 includes a first substrate layer 51 and a second substrate layer 52 laminated on the side of the first substrate layer 51 opposite to the side facing the support layer 40. According to the present preferred embodiment, the first substrate layer 51 is made of $SiO_2$, and the second substrate layer 52 is made of a single crystal Si.

Subsequently, components of the outer base 110 will be described. FIG. 5 is a cross-sectional view of the piezoelectric device illustrated in FIG. 3 taken along line V-V and viewed in the arrow direction. As illustrated in FIGS. 4 and 5, as in the protruding base 120, the outer base 110 includes the piezoelectric layer 10, the first electrode layer 20, the second electrode layer 30, the support layer 40, and the substrate layer 50. In the in-plane direction orthogonal to the axial direction of the center axis, the piezoelectric layer 10, the first electrode layer 20, the second electrode layer 30, the support layer 40, and the substrate layer 50 of the outer base 110 are respectively continuous with the piezoelectric layer 10, the first electrode layer 20, the second electrode layer 30, the support layer 40, and the substrate layer 50 of the protruding base 120.

As illustrated in FIGS. 3 and 5, in the outer base 110, the second electrode layer 30 is disposed not to oppose the first electrode layer 20 with the piezoelectric layer 10 interposed therebetween.

As illustrated in FIGS. 3 and 5, the outer base 110 further includes a first connection electrode layer 60 and a second connection electrode layer 70.

The first connection electrode layer 60 is exposed to the outside while being electrically connected to the first electrode layer 20 through a close contact layer not illustrated. Specifically, the first connection electrode layer 60 is provided in the outer base 110 on the side of the first electrode layer 20 opposite to the side facing the piezoelectric layer 10.

The second connection electrode layer 70 is exposed to the outside while being electrically connected to the second electrode layer 30 through a close contact layer not illustrated. Specifically, the second connection electrode layer 70 is provided in the outer base 110 on the side of the second electrode layer 30 opposite to the side facing the support layer 40.

The thickness of each of the first connection electrode layer 60 and the second connection electrode layer 70 is, for example, greater than or equal to about 0.1 μm and smaller than or equal to about 1.0 μm. The thickness of each of the close contact layer connected to the first connection electrode layer 60 and the close contact layer connected to the second connection electrode layer 70 is, for example, greater than or equal to about 0.005 μm and smaller than or equal to about 0.1 μm.

According to the present preferred embodiment, the first connection electrode layer 60 and the second connection electrode layer 70 are made of Au. The first connection electrode layer 60 and the second connection electrode layer 70 may be made of another electrically conductive material such as Al. The close contact layer connected to the first connection electrode layer 60 and the close contact layer connected to the second connection electrode layer 70 are made of, for example, Ti. Instead, these close contact layers may be made of NiCr.

As illustrated in FIGS. 2 and 4, the piezoelectric device 100 according to the present preferred embodiment also includes a cavity 140. The cavity 140 is defined by being surrounded by the outer base 110, the protruding base 120, and the cantilevered portion 130. The cavity 140 is open to the side opposite to the side where the cantilevered portion 130 is disposed. As illustrated in FIG. 2, when the piezoelectric device 100 is viewed from the substrate layer 50, the cavity 140 has a recessed profile surrounded by the outer base 110 and the protruding base 120.

Figure 6:
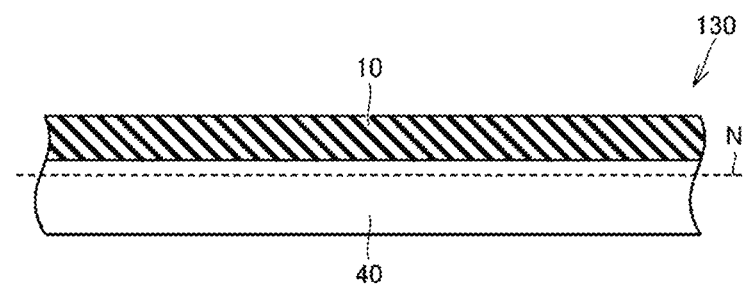
FIG. 6 is a cross-sectional view of the piezoelectric device according to Preferred Embodiment 1 of the present invention, schematically illustrating a portion of a cantilevered portion while the piezoelectric device is driven.
Figure 7:
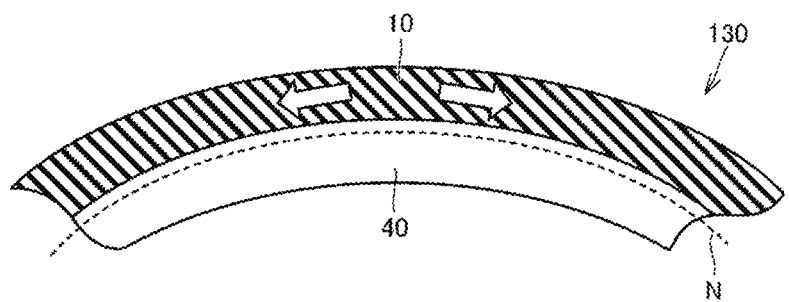
FIG. 7 is a cross-sectional view of the piezoelectric device according to Preferred Embodiment 1 of the present invention, schematically illustrating a portion of a cantilevered portion while the piezoelectric device is driven.

Now, a mechanism by which the cantilevered portion 130 in the piezoelectric device 100 according to Preferred Embodiment 1 of the present invention vibrates will be described. FIG. 6 is a cross-sectional view of the piezoelectric device according to Preferred Embodiment 1 of the present invention, schematically illustrating a portion of a cantilevered portion. FIG. 7 is a cross-sectional view of the piezoelectric device according to Preferred Embodiment 1 of the present invention, schematically illustrating a portion of a cantilevered portion while the piezoelectric device is driven. FIGS. 6 and 7 do not illustrate the first electrode layer 20 and the second electrode layer 30.

As illustrated in FIGS. 6 and 7, in the cantilevered portion 130 according to the present preferred embodiment, the piezoelectric layer 10 functions as an expansion/contraction layer expansible in the in-plane direction of a plane orthogonal to the axial direction of the center axis, and the layers other than the piezoelectric layer 10 function as restricted layers. According to the present preferred embodiment, the support layer 40 functions as a main restricted layer. Thus, the restricted layer is laminated on the expansion/contraction layer in the direction orthogonal to the expansion/contraction direction of the expansion/contraction layer. Instead of the restricted layer, the cantilevered portion 130 may include a reverse expansion/contraction layer that contracts in the in-plane direction when the expansion/contraction layer expands in the in-plane direction, and that expands in the in-plane direction when the expansion/contraction layer contracts in the in-plane direction.

When the piezoelectric layer 10 defining and functioning as the expansion/contraction layer tries to expand or contract in the in-plane direction, the support layer 40 defining and functioning as a main restricted layer restricts expansion and contraction of the piezoelectric layer 10 at the surface at which the support layer 40 is joined to the piezoelectric layer 10. In the cantilevered portion 130 according to the present preferred embodiment, the piezoelectric layer 10 defining and functioning as the expansion/contraction layer is located on only one side of a stress neutral plane N of the cantilevered portion 130. The center of gravity of the support layer 40 of the main restricted layer is located on the other side of the stress neutral plane N. Thus, as illustrated in FIGS. 6 and 7, when the piezoelectric layer 10 defining and functioning as an expansion/contraction layer expands or contracts in the in-plane direction of the plane, the cantilevered portion 130 bends in the direction orthogonal to the plane. The amount by which the cantilevered portion 130 is displaced when bends increase as the distance by which the stress neutral plane N and the piezoelectric layer 10 are spaced apart from each other increases. The amount of displacement increases as the stress to expand or contract the piezoelectric layer 10 increases. Thus, the cantilevered portion 130 bends and vibrates in the direction orthogonal to the plane originating from the fixed end portion 131 illustrated in FIGS. 1 to 5.

Figure 8:
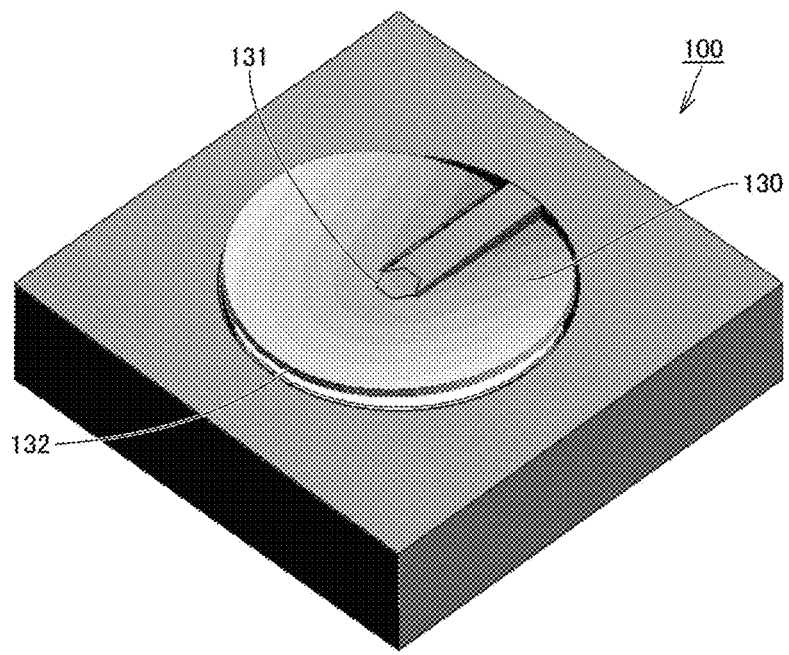
FIG. 8 is a perspective view of the piezoelectric device according to Preferred Embodiment 1 of the present invention, illustrating the state of vibrating in a desired vibration mode in simulation.

As illustrated in FIG. 1, the piezoelectric device 100 according to the present preferred embodiment includes only one cantilevered portion 130. This structure does not lower the device characteristics, unlike in a piezoelectric device including multiple cantilevered portions located adjacent to each other in which the multiple cantilevered portions may vibrate in different phases and lower the device characteristics. FIG. 8 is a perspective view of the piezoelectric device according to Preferred Embodiment 1 of the present invention, illustrating the state of vibrating in a desired vibration mode in simulation. FIG. 8 illustrates the piezoelectric device 100 with some components omitted. In FIG. 8, the cantilevered portion 130 is illustrated with colors that become lighter as the amount of displacement by which the cantilevered portion 130 is displaced in the axial direction of the center axis increases. FIG. 8 illustrates the piezoelectric device 100 where the cantilevered portion 130 is displaced in the direction toward the first electrode layer 20 illustrated in FIG. 4. As illustrated in FIG. 8, the cantilevered portion 130 is driven to have the free periphery 132 vibrate originating from the fixed end portion 131.

The piezoelectric device 100 according to the present preferred embodiment has higher device characteristics particularly when used as an ultrasonic transducer. Hereinbelow, the function of the piezoelectric device 100 according to the present preferred embodiment when the piezoelectric device 100 is used as an ultrasonic transducer will be described.

First, as illustrated in FIG. 3, for the piezoelectric device 100 to generate ultrasonic waves, a voltage is applied across the first connection electrode layer 60 and the second connection electrode layer 70. Then, as illustrated in FIGS. 3 to 5, a voltage is applied across the first electrode layer 20 connected to the first connection electrode layer 60 and the second electrode layer 30 connected to the second connection electrode layer 70. Thus, also in the cantilevered portion 130, a voltage is applied across the first electrode layer 20 and the second electrode layer 30 that oppose each other with the piezoelectric layer 10 interposed therebetween. Then, the piezoelectric layer 10 expands or contracts in the in-plane direction of the plane. With the above mechanism, the cantilevered portion 130 bends and vibrates in the direction orthogonal to the plane. A force is thus exerted on a medium surrounding the piezoelectric device 100 and the medium vibrates, and thus ultrasonic waves are generated.

In the piezoelectric device 100 according to the present preferred embodiment, the cantilevered portion 130 has intrinsic mechanical resonant frequency. Thus, when the applied voltage is a sinusoidal voltage and the frequency of the sinusoidal voltage is approximate to the value of the resonant frequency, the cantilevered portion 130 bends by a large amount of displacement.

The piezoelectric device 100 detects ultrasonic waves as follows. The medium surrounding the cantilevered portion 130 is vibrated by the ultrasonic waves, the surrounding medium exerts a force on the cantilevered portion 130, and the cantilevered portion 130 bends and vibrates. When the cantilevered portion 130 bends and vibrates, a stress is applied to the piezoelectric layer 10. The application of the stress to the piezoelectric layer 10 induces electric charges in the piezoelectric layer 10. The electric charges induced in the piezoelectric layer 10 cause a potential difference between the first electrode layer 20 and the second electrode layer 30 opposing each other with the piezoelectric layer 10 interposed therebetween. The potential difference is detected by the first connection electrode layer 60 connected to the first electrode layer 20 and the second connection electrode layer 70 connected to the second electrode layer 30. Thus, the piezoelectric device 100 can detect ultrasonic waves.

When the ultrasonic waves that are to be detected include a large quantity of a specific frequency component and this frequency component is approximate to the value of the resonant frequency, the cantilevered portion 130 bends and vibrates by a larger amount of displacement. The increase of the amount of displacement increases the potential difference.

Thus, when the piezoelectric device 100 according to the present preferred embodiment is used as an ultrasonic transducer, the resonant frequency of the cantilevered portion 130 is important.

In the piezoelectric device 100, when the shortest distance from the fixed end portion 131 to the free periphery 132 varies, the resonant frequency of the cantilevered portion 130 varies. According to the present preferred embodiment, the free periphery 132 is located along the internal circumferential surface 111, and the protrusion 121 is designed to be located between the first end 132a and the second end 132b of the free periphery 132. Thus, the shortest distance from the fixed end portion 131 to the free periphery 132 is designed to be a predetermined length to approximate the resonant frequency of the cantilevered portion 130 to the frequency of the sinusoidal voltage. In addition, as described above, the free periphery 132 is disposed along the internal circumferential surface 111, and the protrusion 121 is located between the first end 132a and the second end 132b of the free periphery 132 to increase the length of the free periphery 132. Thus, the area of the cantilevered portion 130 is increased. Thus, for example, the volume of a medium surrounding the cantilevered portion 130 and pushed by the cantilevered portion 130 when a predetermined voltage is applied to the piezoelectric layer 10 increases, and thus the piezoelectric device 100 can improve the device characteristics. Specifically, the piezoelectric device 100 can improve the device characteristics while reducing changes in resonant frequency of the cantilevered portion 130.

For example, to design the resonant frequency of the cantilevered portion 130 of the piezoelectric device 100 according to Preferred Embodiment 1 of the present invention to be around 40 kHz, the piezoelectric layer 10 may be made of lithium niobate, the piezoelectric layer 10 may have a thickness of about 1 μm, the first electrode layer 20 and the second electrode layer 30 may each have a thickness of about 0.1 μm, the first support layer 41 may have a thickness of about 0.8 μm, the second support layer 42 may have a thickness of about 3.8 μm, the shortest distance from the fixed end portion 131 to the free periphery 132 of the cantilevered portion 130 may be set as about 400 μm, the free periphery 132 may be disposed along the internal circumferential surface 111, and the protrusion 121 may be disposed between the first end 132a and the second end 132b of the free periphery 132.

Figure 9:
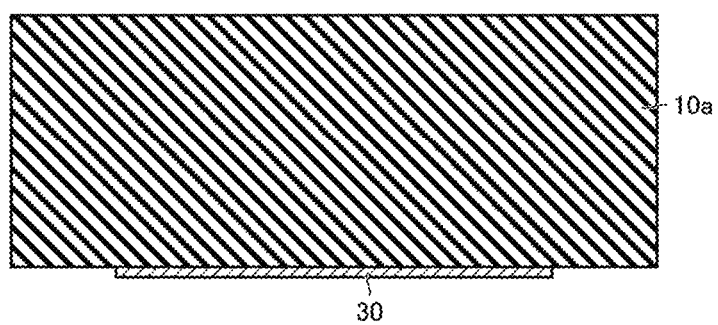
FIG. 9 is a cross-sectional view describing a method for manufacturing the piezoelectric device according to Preferred Embodiment 1 of the present invention, illustrating the state where a second electrode layer is disposed on a piezoelectric single-crystal substrate.

Hereinbelow, a non-limiting example of a method for manufacturing the piezoelectric device 100 according to Preferred Embodiment 1 of the present invention will be described. FIG. 9 is a cross-sectional view describing a method for manufacturing the piezoelectric device according to Preferred Embodiment 1 of the present invention, illustrating the state where a second electrode layer is disposed on a piezoelectric single-crystal substrate. FIG. 9 and FIGS. 10 to 14 described later are cross-sectional views taken along the same line as that in FIG. 4.

As illustrated in FIG. 9, first, a close contact layer (not illustrated) is disposed on the lower surface of a piezoelectric single-crystal substrate 10a, and then a second electrode layer 30 is disposed on the side of the close contact layer opposite to the side where the piezoelectric single-crystal substrate 10a is disposed. The second electrode layer 30 is formed to have a desired pattern by a vapor deposition liftoff technique. The second electrode layer 30 may be formed by being laminated over the entire lower surface of the piezoelectric single-crystal substrate 10a by sputtering, and then being formed into a desired pattern by etching. The second electrode layer 30 and the close contact layer may be epitaxially grown.

Figure 10:
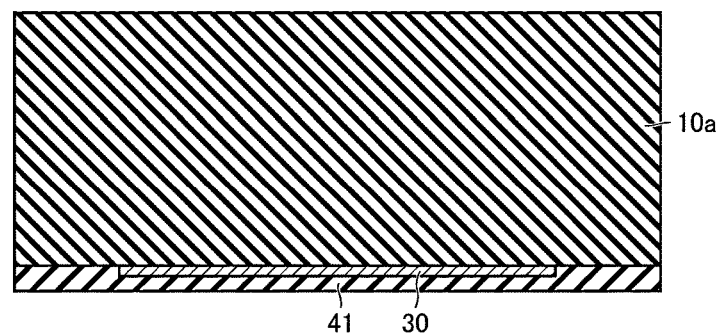
FIG. 10 is a cross-sectional view describing a method for manufacturing the piezoelectric device according to Preferred Embodiment 1 of the present invention, illustrating the state of disposing a first support layer.

FIG. 10 is a cross-sectional view describing a non-limiting example of a method for manufacturing the piezoelectric device according to Preferred Embodiment 1 of the present invention, illustrating the state of disposing a first support layer.

As illustrated in FIG. 10, the first support layer 41 is disposed on the lower surfaces of the piezoelectric single-crystal substrate 10a and the second electrode layer 30 through chemical vapor deposition (CVD) or physical vapor deposition (PVD). Immediately after the first support layer 41 is disposed, the portion of the lower surface of the first support layer 41 located on the side opposite to the side where the second electrode layer 30 is located rises. Thus, the lower surface of the first support layer 41 is ground through, for example, chemical mechanical polishing (CMP) to be flattened.

Figure 11:
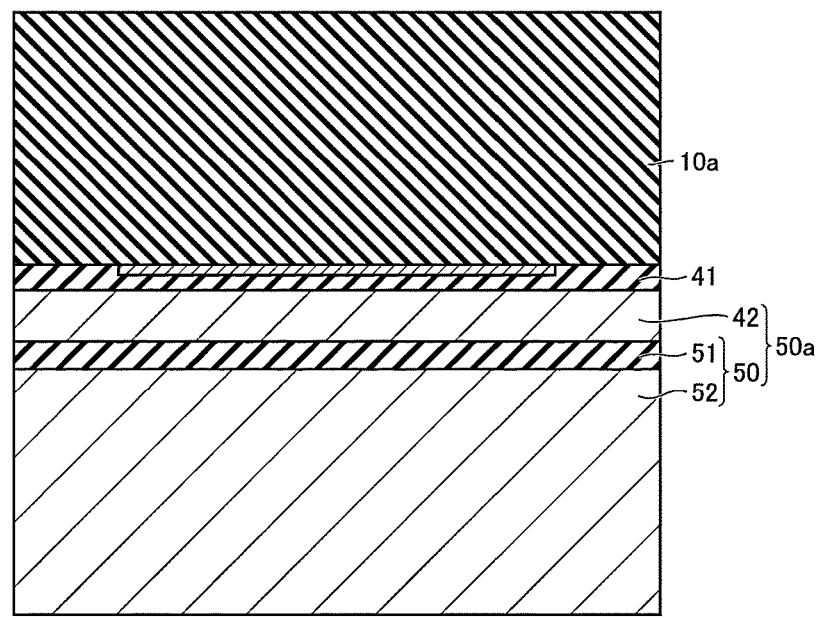
FIG. 11 is a cross-sectional view describing a method for manufacturing the piezoelectric device according to Preferred Embodiment 1 of the present invention, illustrating the state of joining a multilayer body to the first support layer.

FIG. 11 is a cross-sectional view describing a method for manufacturing the piezoelectric device according to Preferred Embodiment 1 of the present invention, illustrating the state of joining a multilayer body to the first support layer.

As illustrated in FIG. 11, a multilayer body 50a including the second support layer 42 and the substrate layer 50 is joined to the lower surface of the first support layer 41 through surface activated bonding or atomic diffusion bonding. According to the present preferred embodiment, the multilayer body 50a is a silicon on insulator (SOI) substrate. When the upper surface of the second support layer 42 is flattened in advance through CMP, the yield of the piezoelectric device 100 improves.

Figure 12:
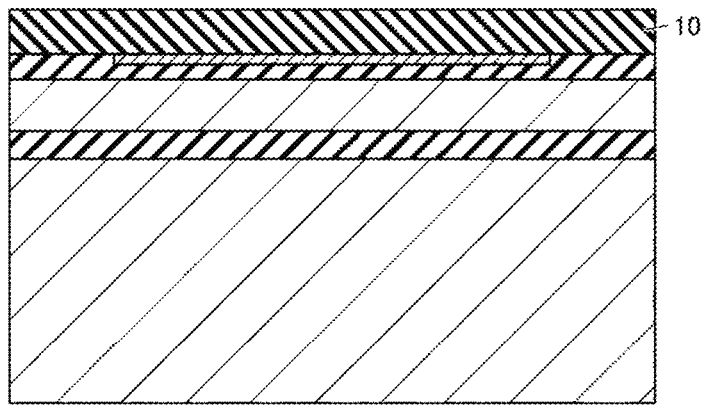
FIG. 12 is a cross-sectional view describing a method for manufacturing the piezoelectric device according to Preferred Embodiment 1 of the present invention, illustrating the state of forming a piezoelectric layer by grinding the piezoelectric single-crystal substrate.

FIG. 12 is a cross-sectional view describing a method for manufacturing the piezoelectric device according to Preferred Embodiment 1 of the present invention, illustrating the state of forming a piezoelectric layer by grinding the piezoelectric single-crystal substrate.

As illustrated in FIG. 11 and FIG. 12, the upper surface of the piezoelectric single-crystal substrate 10a is ground by a grinder to thin the piezoelectric single-crystal substrate 10a. The upper surface of the thinned piezoelectric single-crystal substrate 10a is further polished through CMP to form the piezoelectric single-crystal substrate 10a into the piezoelectric layer 10.

Instead, ions may be implanted in advance into the upper surface of the piezoelectric single-crystal substrate 10a to form a release layer, and the release layer may be released to form the piezoelectric single-crystal substrate 10a into the piezoelectric layer 10. Instead, the upper surface of the piezoelectric single-crystal substrate 10a obtained after releasing the release layer may be further polished through, for example, CMP to form the piezoelectric single-crystal substrate 10a into the piezoelectric layer 10.

Figure 13:
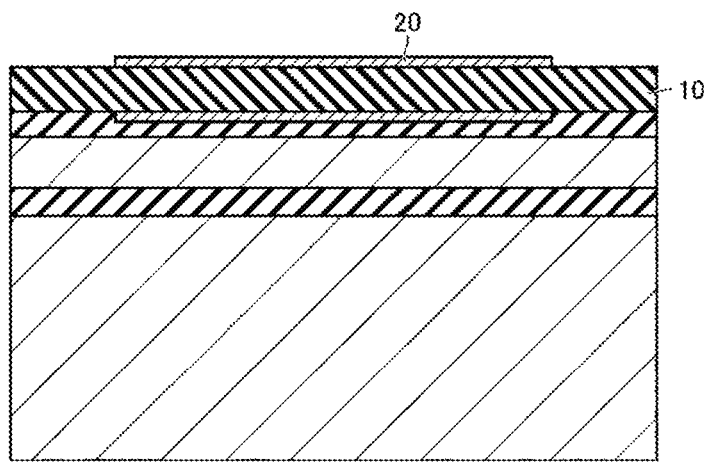
FIG. 13 is a cross-sectional view describing a method for manufacturing the piezoelectric device according to Preferred Embodiment 1 of the present invention, illustrating the state of forming a first electrode layer on the piezoelectric layer.

FIG. 13 is a cross-sectional view describing a method for manufacturing the piezoelectric device according to Preferred Embodiment 1 of the present invention, illustrating the state of forming a first electrode layer on the piezoelectric layer.

As illustrated in FIG. 13, after a close contact layer not illustrated is disposed on the upper surface of the piezoelectric layer 10, the first electrode layer 20 is disposed on the side of the close contact layer opposite to the side facing the piezoelectric layer 10. The first electrode layer 20 is formed by a vapor deposition liftoff technique to have a predetermined pattern. Instead, the first electrode layer 20 may be formed by being laminated over the entire upper surface of the piezoelectric layer 10 through sputtering and then by being formed into a predetermined pattern by etching. The piezoelectric layer 10 and the close contact layer may be epitaxially grown.

Figure 14:
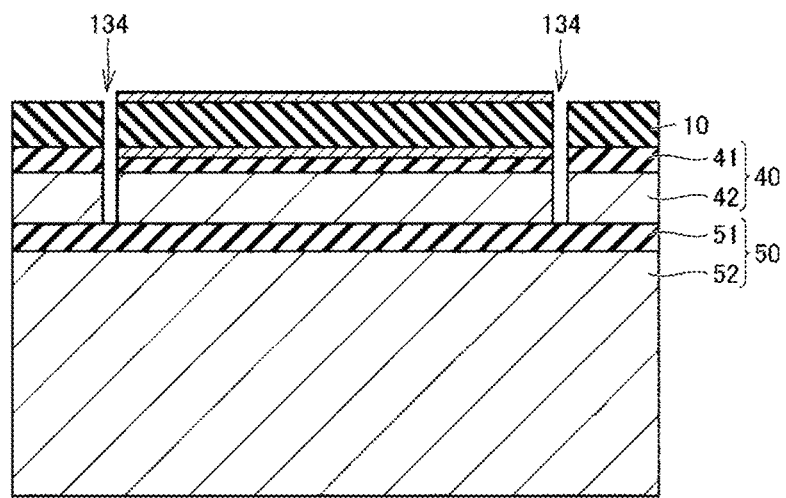
FIG. 14 is a cross-sectional view describing a method for manufacturing the piezoelectric device according to Preferred Embodiment 1 of the present invention, illustrating the state of forming a slit in the piezoelectric layer from a side of the piezoelectric layer opposite to the side facing the support layer to an upper surface of the support layer.
Figure 15:
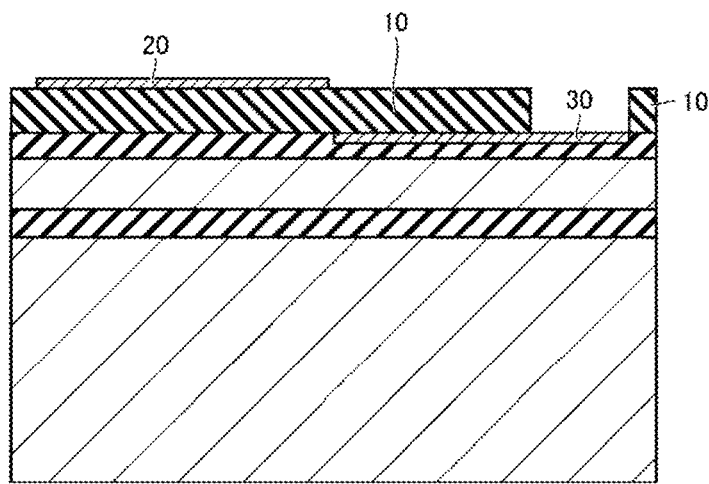
FIG. 15 is a cross-sectional view describing a method for manufacturing the piezoelectric device according to Preferred Embodiment 1 of the present invention, illustrating the state of forming a through-hole in the piezoelectric layer from a side of the piezoelectric layer opposite to the side facing the support layer to an upper surface of the second electrode layer.

FIG. 14 is a cross-sectional view describing a method for manufacturing the piezoelectric device according to Preferred Embodiment 1 of the present invention, illustrating the state of forming a first slit in the piezoelectric layer from a side of the piezoelectric layer opposite to the side facing the support layer to an upper surface of the support layer. FIG. 15 is a cross-sectional view describing a method for manufacturing the piezoelectric device according to Preferred Embodiment 1 of the present invention, illustrating the state of forming a through-hole in the piezoelectric layer from a side of the piezoelectric layer opposite to the side facing the support layer to an upper surface of the second electrode layer. FIG. 15 is a cross-sectional view taken along the same line as that in FIG. 5.

As illustrated in FIG. 14, a slit is formed in the piezoelectric layer 10 and the first support layer 41 by dry etching with reactive ion etching (RIE). The slit may be formed by wet etching using a mixture of hydrofluoric acid and nitric acid. The second support layer 42 exposed to the slit is etched by deep reactive ion etching (DRIE) to allow the slit to reach the upper surface of the substrate layer 50. Thus, the first slit 134 is formed. The second slits 135 shown in FIG. 1 are formed in the same manner as in the case of the first slit 134.

As illustrated in FIG. 15, in the portion corresponding to the outer base 110 illustrated in FIG. 5, the piezoelectric layer 10 is etched to expose a portion of the second electrode layer 30 by dry etching or wet etching.

As illustrated in FIGS. 15 and 5, at the portion corresponding to the outer base 110, close contact layers not illustrated are disposed on the first electrode layer 20 and the second electrode layer 30, and the first connection electrode layer 60 and the second connection electrode layer 70 are disposed on the upper surfaces of the close contact layers through a vapor deposition liftoff technique. The first connection electrode layer 60 and the second connection electrode layer 70 may be laminated by sputtering over the entirety of the piezoelectric layer 10, the first electrode layer 20, and the exposed portion of the second electrode layer 30, and formed into a desired pattern by etching.

Finally, as illustrated in FIGS. 14 and 4, a portion of the substrate layer 50 is removed by DRIE. Thus, the outer base 110, the protruding base 120, the cantilevered portion 130, and the cavity 140 are formed. With the above processes, the piezoelectric device 100 according to Preferred Embodiment 1 of the present invention as illustrated in FIGS. 1 to 5 are manufactured.

As described above, the piezoelectric device 100 according to Preferred Embodiment 1 of the present invention includes the outer base 110, the protruding base 120, and the only one cantilevered portion 130. The outer base 110 has a ring shape and has the internal circumferential surface 111. The protruding base 120 includes the protrusion 121 and the tip portion 122. The protrusion 121 protrudes from the internal circumferential surface 111 of the outer base 110 toward the center C of the ring shape. The tip portion 122 is connected to the protrusion 121 and located at the center C. The cantilevered portion 130 is connected to the tip portion 122, and extends while being spaced apart from the protrusion 121. The cantilevered portion 130 includes the piezoelectric layer 10, the first electrode layer 20, and the second electrode layer 30. The first electrode layer 20 is disposed on one side of the piezoelectric layer 10. The second electrode layer 30 is disposed to oppose at least a portion of the first electrode layer 20 with the piezoelectric layer 10 interposed therebetween. The cantilevered portion 130 includes the fixed end portion 131 and the free periphery 132. The fixed end portion 131 is connected to the tip portion 122. The free periphery 132 is located along the internal circumferential surface 111. The protrusion 121 is located between the first end 132a and the second end 132b of the free periphery 132.

Thus, the piezoelectric device 100 can improve the device characteristics while reducing changes in resonant frequency of the cantilevered portion 130 and while increasing the volume of a medium surrounding the cantilevered portion 130 and pushed by the cantilevered portion 130 when a predetermined voltage is applied to the piezoelectric layer 10. When a predetermined voltage is applied to the piezoelectric layer 10, the piezoelectric device 100 used as, for example, an ultrasonic transducer can increase the sound pressure of ultrasonic waves caused by vibrations of the cantilevered portion 130.

According to the present preferred embodiment, when viewed in the axial direction of the center axis of the internal circumferential surface 111, that is, in the axial direction of the center axis of the ring shape, the area of the opposing portion where the first electrode layer 20 opposes the second electrode layer 30 is greater than or equal to about 90% of the area of the cantilevered portion 130.

This structure can improve the electromechanical coupling coefficient of the cantilevered portion 130 defining and functioning as a vibrator. Thus, the piezoelectric device 100 can improve the device characteristics.

According to the present preferred embodiment, the piezoelectric layer 10 is made of lithium niobate ($LiNbO_3$) or lithium tantalate ($LiTaO_3$).

This structure can improve the piezoelectricity of the piezoelectric layer 10, and thus the piezoelectric device 100 can improve the device characteristics.

Preferred Embodiment 2

Hereinbelow, a piezoelectric device according to Preferred Embodiment 2 of the present invention will be described. The piezoelectric device according to Preferred Embodiment 2 of the present invention differs from the piezoelectric device 100 according to Preferred Embodiment 1 of the present invention mainly in the shape of the free periphery. The components the same as those of the piezoelectric device 100 according to Preferred Embodiment 1 of the present invention will not be described redundantly.

Figure 16:
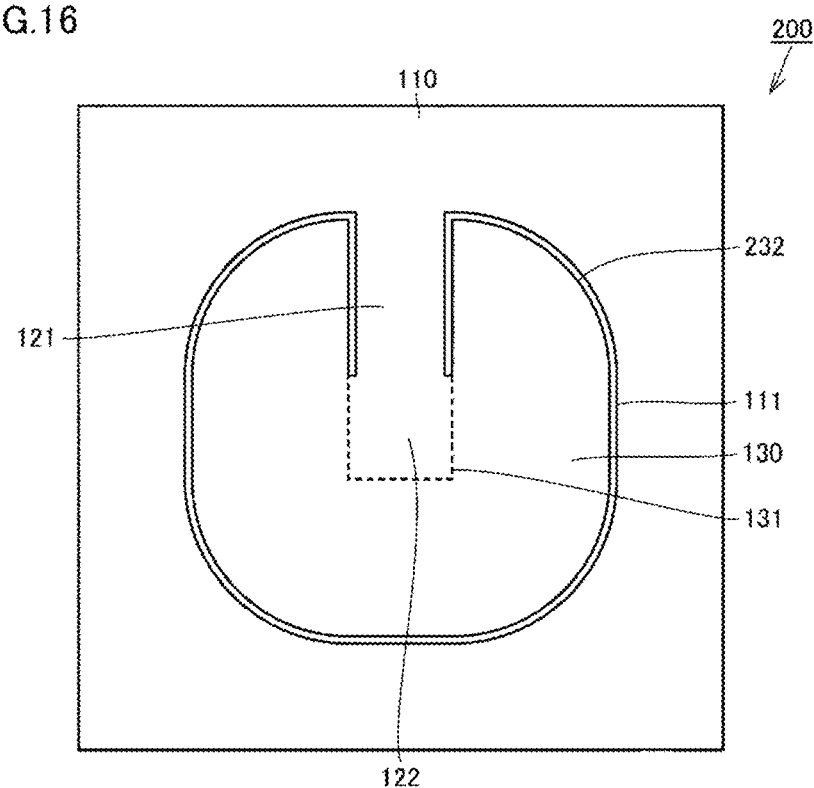
FIG. 16 is a plan view of a piezoelectric device according to Preferred Embodiment 2 of the present invention.

FIG. 16 is a plan view of a piezoelectric device according to Preferred Embodiment 2 of the present invention. As illustrated in FIG. 16, in a piezoelectric device 200 according to Preferred Embodiment 2 of the present invention, the shortest distance from the fixed end portion 131 to a free periphery 232 is uniform or substantially uniform throughout the free periphery 232. Thus, the cantilever is uniformly displaced as a whole, and the device characteristics of the piezoelectric device 200 are stabilized. The case where the shortest distance from the fixed end portion 131 to the free periphery 232 is uniform throughout the free periphery 232 includes a case where the shortest distance falls within a range of about +/−5% of the mean value of the shortest distance throughout the free periphery 232.

According to the present preferred embodiment, the cantilevered portion 130 radially extends from the center of the ring shape of the outer base 110. According to the present preferred embodiment, when viewed in the axial direction of the center axis of the ring shape, the tip portion 122 is rectangular, and is connected to the protrusion 121 at one of four sides of the tip portion 122. The cantilevered portion 130 is connected to the other three of the four sides of the tip portion 122. When viewed in the axial direction of the center axis of the ring shape, each of the internal circumferential surface 111 and the free periphery 232 is located on a substantial virtual rectangle with rounded corners.

According to the present preferred embodiment, the tip portion 122, the free periphery 232, and the internal circumferential surface 111 may have any shape when viewed in the axial direction of the center axis of the ring shape. The tip portion 122 may have a shape of a substantial rectangle with rounded corners, an ellipse, or a circle when viewed in the axial direction of the center axis of the ring shape. When viewed in the axial direction of the center axis of the ring shape, each of the free periphery 232 and the internal circumferential surface 111 may be located on a virtual circle or a virtual ellipse.

Preferred Embodiment 3

Hereinbelow, a piezoelectric device according to Preferred Embodiment 3 of the present invention will be described. The piezoelectric device according to Preferred Embodiment 3 of the present invention differs from the piezoelectric device 100 according to Preferred Embodiment 1 of the present invention mainly in the shape of the tip portion. The components the same as those of the piezoelectric device 100 according to Preferred Embodiment 1 of the present invention will not be described redundantly.

Figure 17:
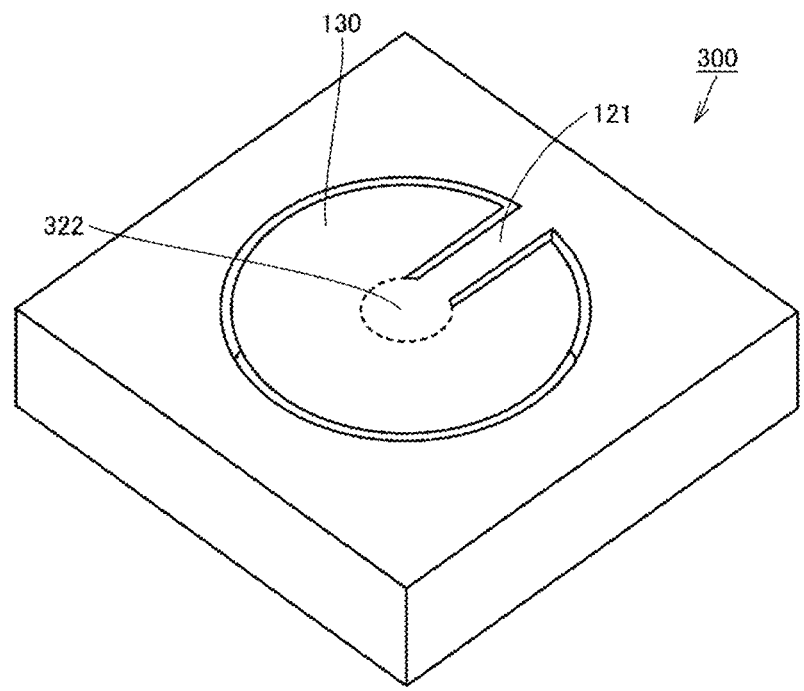
FIG. 17 is a perspective view of a piezoelectric device according to Preferred Embodiment 3 of the present invention, viewed from one side.
Figure 18:
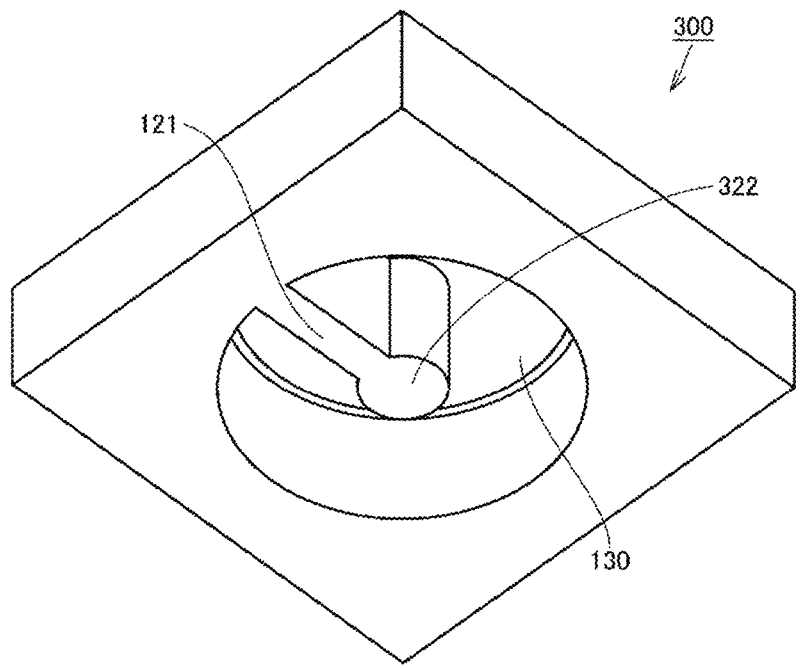
FIG. 18 is a perspective view of the piezoelectric device according to Preferred Embodiment 3 of the present invention, viewed from another side.

FIG. 17 is a perspective view of a piezoelectric device according to Preferred Embodiment 3 of the present invention, viewed from one side. FIG. 18 is a perspective view of the piezoelectric device according to Preferred Embodiment 3 of the present invention, viewed from another side.

As illustrated in FIGS. 17 and 18, in a piezoelectric device 300 according to Preferred Embodiment 3 of the present invention, when viewed in the axial direction of the center axis of the ring shape, the width of a tip portion 322 in the direction orthogonal to the direction in which the protrusion 121 protrudes is greater than the width of the protrusion 121 in the orthogonal direction. Thus, the stress applied to the cantilevered portion 130 at deformation may be reduced, and thus, the piezoelectric device 300 improves its reliability.

According to the present preferred embodiment, specifically, when viewed in the axial direction of the center axis of the ring shape, the tip portion 322 has a circular profile. When viewed in the axial direction of the central axis, the diameter of the tip portion 322 is greater than the width of the protrusion 121 in the orthogonal direction.

Preferred Embodiment 4

Hereinbelow, a piezoelectric device according to Preferred Embodiment 4 of the present invention will be described. The piezoelectric device according to Preferred Embodiment 4 of the present invention differs from the piezoelectric device 100 according to Preferred Embodiment 1 of the present invention mainly in the shape of the protrusion. The components the same as those of the piezoelectric device 100 according to Preferred Embodiment 1 of the present invention will not be described redundantly.

Figure 19:
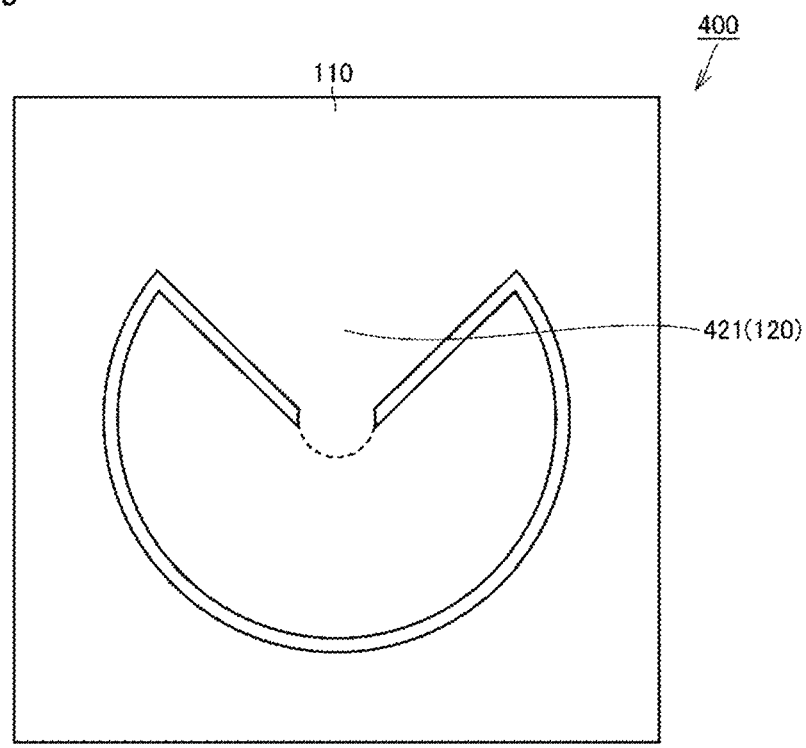
FIG. 19 is a plan view of a piezoelectric device according to Preferred Embodiment 4 of the present invention.

FIG. 19 is a plan view of a piezoelectric device according to Preferred Embodiment 4 of the present invention. As illustrated in FIG. 19, in a piezoelectric device 400 according to Preferred Embodiment 4 of the present invention, the width of a protrusion 421 in the direction orthogonal to the direction in which the protrusion 421 protrudes increases as the protrusion 421 is located closer to the outer base 110. Thus, the strength of the protrusion 421 improves, and the reduction of yield due to the protruding base 120 being folded at the protrusion 421 during manufacturing of the piezoelectric device 400 can be reduced.

Preferred Embodiment 5

Hereinbelow, a piezoelectric device according to Preferred Embodiment 5 of the present invention will be described. The piezoelectric device according to Preferred Embodiment 5 of the present invention differs from the piezoelectric device 100 according to Preferred Embodiment 1 of the present invention mainly in the shape of the protruding base. The components the same as those of the piezoelectric device 100 according to Preferred Embodiment 1 of the present invention will not be described redundantly.

FIG. 20 is a cross-sectional view of a piezoelectric device according to Preferred Embodiment 5 of the present invention. FIG. 20 is a cross-sectional view taken by the same line as that in FIG. 4.

As illustrated in FIG. 20, in a piezoelectric device 500 according to Preferred Embodiment 5 of the present invention, the thickness of a protruding base 520 in the axial direction of the center axis of the internal circumferential surface 111, that is, in the axial direction of the center axis of the ring shape of the outer base 110 is smaller than the thickness of the outer base 110. Thus, when the piezoelectric device 500 is to be mounted on a mount substrate, the outer base 110 is connected to the mount substrate, and the protruding base 520 having strength smaller than that of the outer base 110 is not connected to the mount substrate. Thus, the reduction of yield in the mounting process of the piezoelectric device 500 is reduced.

According to the present preferred embodiment, specifically, the thickness of the second substrate layer 52 of the protruding base 520 in the axial direction of the center axis of the internal circumferential surface 111 is smaller than the thickness of the second substrate layer 52 of the outer base 110.

In the description of the above preferred embodiment, structures that can be combined may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device, comprising:
   an outer base that has a ring shape and includes an internal circumferential surface;
   a protruding base that includes a protrusion and a tip portion, the protrusion protruding from the internal circumferential surface of the outer base toward a center of the ring shape, the tip portion being connected to the protrusion and located at the center; and
   only one cantilevered portion that is connected to the tip portion, and extends while being spaced apart from the protrusion; wherein
   the cantilevered portion includes a piezoelectric layer, a first electrode layer located on one side of the piezoelectric layer, and a second electrode layer opposing at least a portion of the first electrode layer with the piezoelectric layer interposed therebetween;
   the cantilevered portion includes a fixed end portion connected to the tip portion and a free periphery located along the internal circumferential surface; and the protrusion is located between a first end and a second end of the free periphery.

2. The piezoelectric device according to claim 1, wherein a shortest distance from the fixed end portion to the free periphery is uniform or substantially uniform throughout the free periphery.

3. The piezoelectric device according to claim 1, wherein a width of the tip portion in an orthogonal direction that is orthogonal to a direction in which the protrusion protrudes is greater than a width of the protrusion in the orthogonal direction.

4. The piezoelectric device according to claim 1, wherein a width of the protrusion in an orthogonal direction that is orthogonal to a direction in which the protrusion protrudes increases as the protrusion is located closer to the outer base.

5. The piezoelectric device according to claim 1, wherein a thickness of the protruding base in an axial direction of a center axis of the internal circumferential surface is smaller than a thickness of the outer base.

6. The piezoelectric device according to claim 1, wherein when viewed in an axial direction of a center axis of the internal circumferential surface, an area of an opposing portion where the first electrode layer opposes the second electrode layer is greater than or equal to about 90% of an area of the cantilevered portion.

7. The piezoelectric device according to claim 1, wherein the piezoelectric layer is made of lithium niobate or lithium tantalate.

8. The piezoelectric device according to claim 1, wherein a diameter of the width portion of the tip portion is equal or substantially equal to a width of the protrusion.

9. The piezoelectric device according to claim 1, wherein the fixed end portion has an arc shape.

10. The piezoelectric device according to claim 1, wherein a slit is in the free periphery and the internal circumferential surface.

11. The piezoelectric device according to claim 10, wherein the first end and the second end of the free periphery are located to allow the slit to reach the protrusion.

12. The piezoelectric device according to claim 10, wherein the first end and the second end of the free periphery are located to allow the slit to reach the side of the protrusion opposite to the side facing the tip portion.

13. The piezoelectric device according to claim 10, wherein additional slits are connected to the slit and located between the protrusion and one of the two side end portions.

14. The piezoelectric device according to claim 13, wherein a width of the slit is equal or substantially equal to widths of the additional slits.

15. The piezoelectric device according to claim 1, wherein the cantilevered portion includes a support layer on a side of the piezoelectric layer facing the second electrode layer.

16. The piezoelectric device according to claim 1, wherein the cantilevered portion includes a support layer on a side of the second electrode layer opposite to a side facing the piezoelectric layer.

17. The piezoelectric device according to claim 16, wherein the support layer includes a first support layer and a second support layer on a side of the first support layer opposite to a side facing the piezoelectric layer.

18. The piezoelectric device according to claim 17, wherein the first support layer is made of $SiO_2$ and the second support layer is made of a single crystal Si.

19. The piezoelectric device according to claim 16, wherein the support layer is thicker than the piezoelectric layer.

20. An ultrasonic transducer comprising the piezoelectric device according to claim 1.

* * * * *